(12) United States Patent
Zhang et al.

(10) Patent No.: US 8,317,279 B2
(45) Date of Patent: Nov. 27, 2012

(54) ELECTRONIC ASSEMBLY

(75) Inventors: Guang-Yi Zhang, Shenzhen (CN); Wei Qiu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 195 days.

(21) Appl. No.: 12/817,214

(22) Filed: Jun. 17, 2010

(65) Prior Publication Data

US 2011/0279006 A1 Nov. 17, 2011

(30) Foreign Application Priority Data

May 11, 2010 (CN) .............................. 201010169047

(51) Int. Cl.
*A47B 88/00* (2006.01)
(52) U.S. Cl. ....................... 312/334.4; 211/26
(58) Field of Classification Search ............... 312/223.1, 312/223.2, 334.4, 334.1, 334.7, 334.8, 334.16; 211/26
See application file for complete search history.

(56) References Cited

U.S. PATENT DOCUMENTS

| | | | | |
|---|---|---|---|---|
| 3,232,687 A * | 2/1966 | Mulreed | ..................... | 312/334.8 |
| 5,492,400 A * | 2/1996 | Rock | ............................. | 312/331 |
| 6,231,143 B1 * | 5/2001 | Stijns | ............................. | 312/331 |
| 6,347,849 B1 * | 2/2002 | Muterthies et al. | ...... | 312/334.12 |
| 6,373,692 B1 * | 4/2002 | Cheng | ........................ | 361/679.59 |
| 6,557,957 B2 * | 5/2003 | Nagata et al. | .............. | 312/223.1 |
| 6,563,700 B1 * | 5/2003 | Waller et al. | ............. | 361/679.09 |
| 6,711,009 B2 * | 3/2004 | Lee et al. | ................. | 361/679.58 |
| 6,789,685 B2 * | 9/2004 | Dean et al. | ....................... | 211/26 |
| 7,239,512 B2 * | 7/2007 | Li | ............................. | 361/679.02 |
| 7,405,926 B2 * | 7/2008 | Wu et al. | ................. | 361/679.27 |
| 2002/0190613 A1 * | 12/2002 | Liu | ............................ | 312/223.2 |
| 2003/0168414 A1 * | 9/2003 | Lauchner et al. | ............... | 211/26 |
| 2007/0057608 A1 * | 3/2007 | Chiu | .......................... | 312/334.1 |
| 2008/0307610 A1 * | 12/2008 | Hsiung et al. | ................. | 16/94 R |
| 2009/0267465 A1 * | 10/2009 | Cheng | ........................ | 312/223.2 |
| 2010/0007252 A1 * | 1/2010 | Liu | ............................ | 312/223.2 |

\* cited by examiner

*Primary Examiner* — James O Hansen
*Assistant Examiner* — Matthew Ing
(74) *Attorney, Agent, or Firm* — Altis Law Group, Inc.

(57) ABSTRACT

An electronic assembly includes a rack, two connecting arms, a case and two guideways. The connecting arms are mounted on opposite sides of the rack, spaced from and facing each other. The case includes a supporting housing and a cover. The supporting housing is sandwiched between the connecting arms, and secured on the connecting arms. Two tracks are formed on the lateral sides of the supporting housing. The cover are formed with two spaced slideways. The cover covers the supporting housing; and two slideways enclose the two tracks and are slidable along the tracks. The guideways are mounted on the connecting arms, respectively. The slideways of the cover slide along the tracks oriented toward the guideways, and engage with the guideways to make the cover slide away from the supporting housing.

11 Claims, 6 Drawing Sheets ated second transition portion 45. The first spreading portion
ELECTRONIC ASSEMBLY

BACKGROUND

1. Technical Field

The present disclosure relates to electronic assemblies, and more particularly to an electronic assembly having a cover which can be assembled or disassembled more easily.

2. Description of Related Art

The conventional electronic assembly includes a rack and a case mounted on the rack. The case includes a cubical, hollow supporting housing and a cover. The supporting housing defines an opening at a top side thereof and receives a plurality of electronic components therein. The cover is mounted on the top side of the supporting housing by a plurality of screws to cover the opening of the supporting housing. When the electronic components, which is received in the supporting housing, need to be replaced or maintained, a worker then disassembles the screws from the electronic assembly one by one, and thereby detaching the cover. When the electronic components are replaced or maintained as a whole in one unit, the cover is assembled to the supporting housing by means of the screws again. The processes of assembly or disassembly of the cover are thereby time-consuming.

It is thus desirable to provide an electronic assembly which can overcome the described limitations.

DETAILED DESCRIPTION

Figure 1:
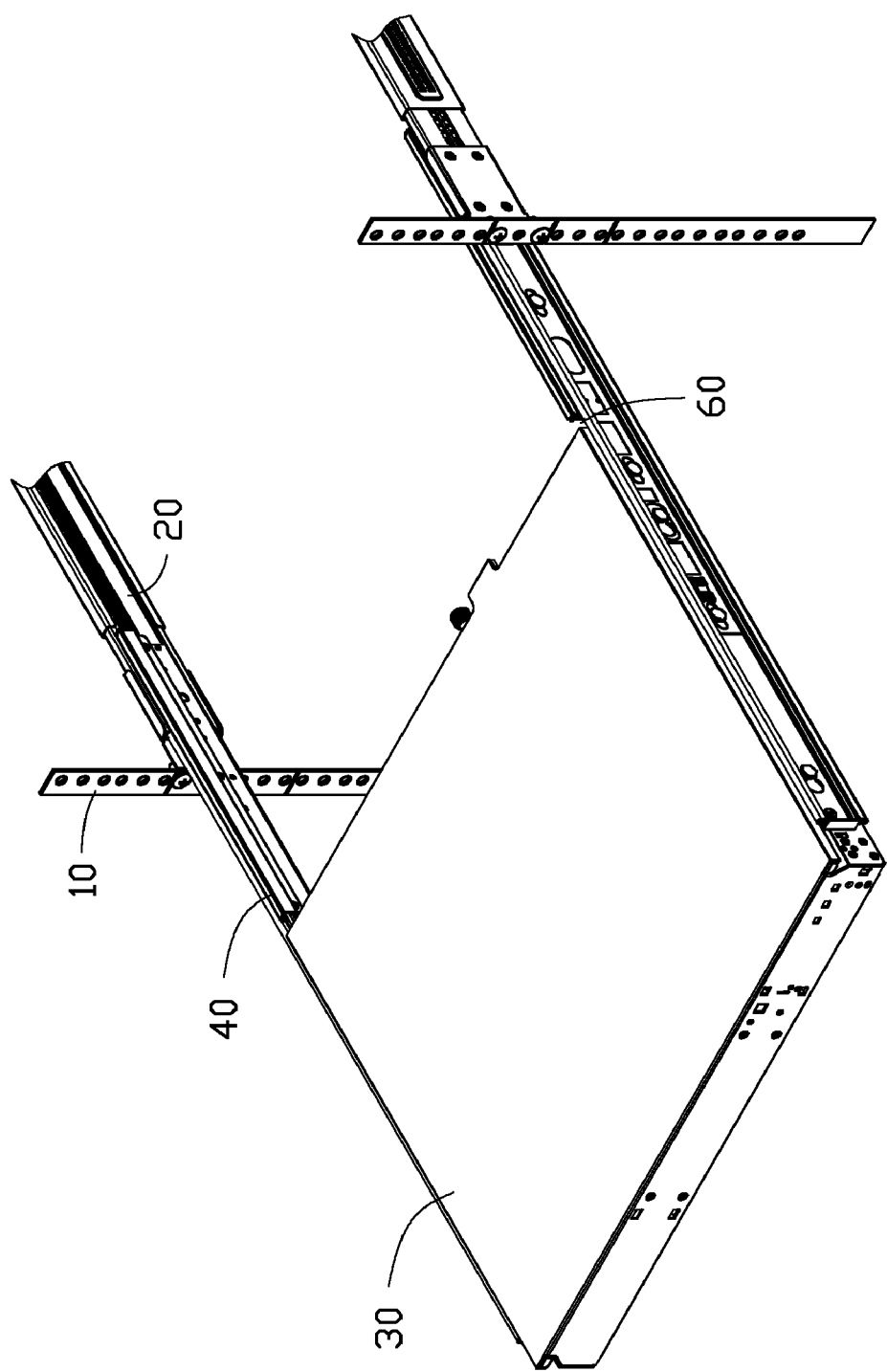
FIG. 1 is an assembled view of an electronic assembly according to an embodiment of the present disclosure, wherein the electronic assembly has a case which include a cover and a supporting housing covered by the cover.
Figure 2:
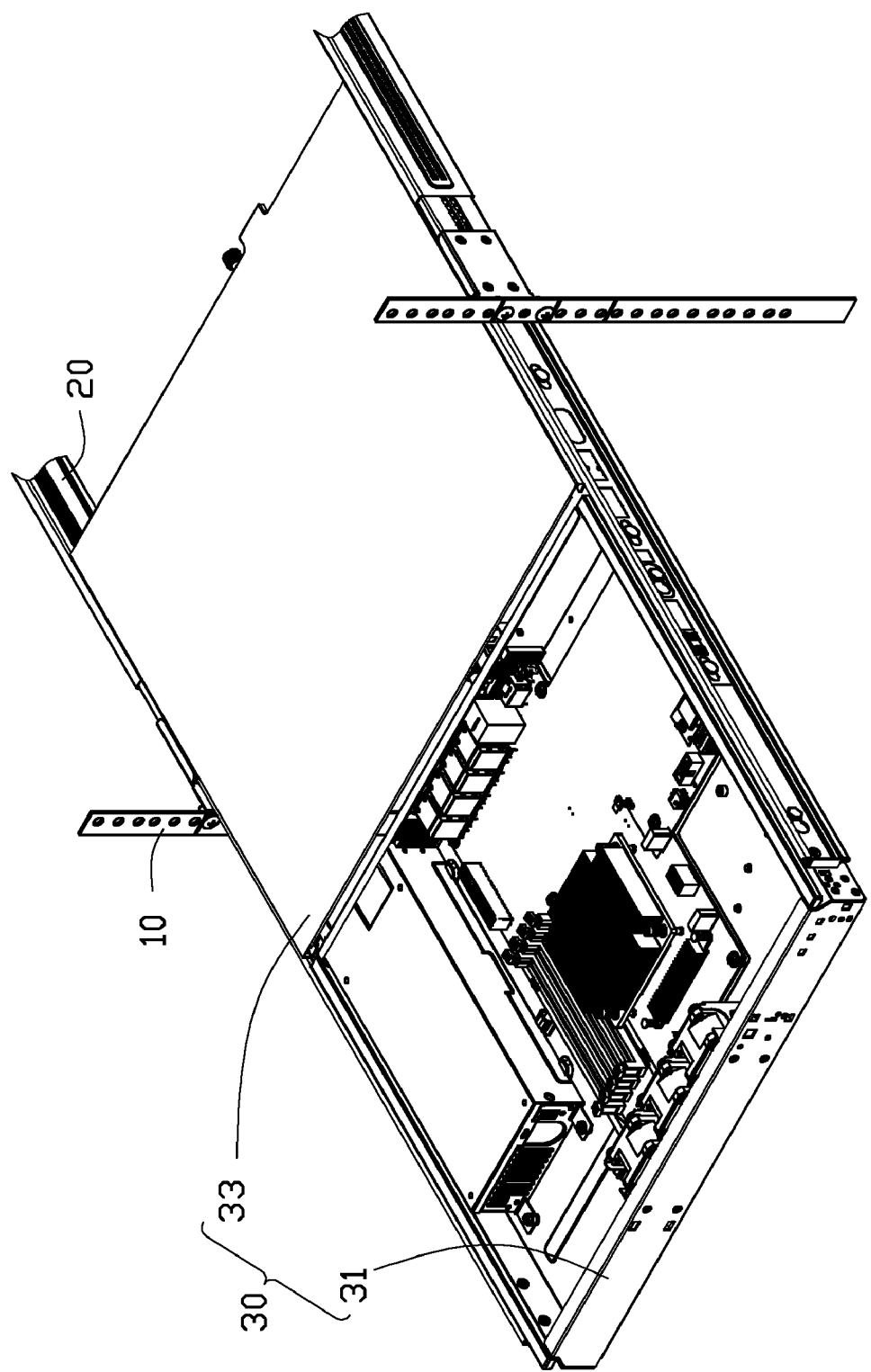
FIG. 2 is similar to FIG. 1, but shows the cover sliding away from the supporting housing.

Referring to FIGS. 1-2, an electronic assembly according to an embodiment of the present disclosure includes a rack 10, two connecting arms 20, a case 30 and two guideways 40. The connecting arms 20 are spaced and mounted on opposite lateral sides of the rack 10. The case 30 is sandwiched between the two connecting arms 20 and secured on the two connecting arms 20. The two guideways 40 are also mounted on the opposite sides of the rack 10 and are appropriately spaced from the case 30. The electronic assembly may be a server, a memory device, a computer, and other types of electronic devices.

In the description that follows, the orientations of all of elements of the electronic assembly of this disclosure accord with orientations of all of the elements of FIG. 1.

Figure 3:
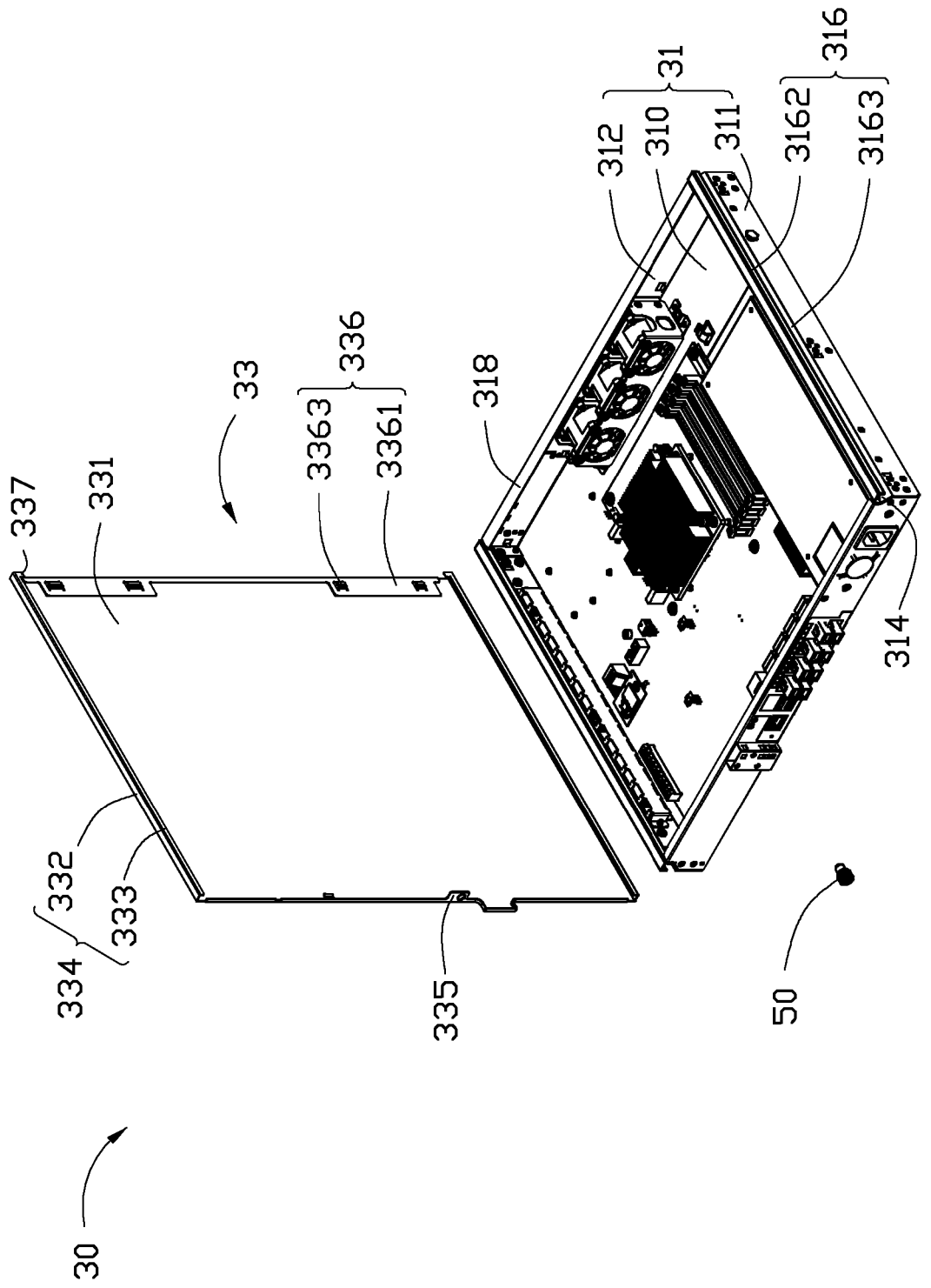
FIG. 3 is an exploded view of the case of FIG. 1 viewed from an opposite aspect.

Referring also to FIG. 3, the case 30 includes a supporting housing 31 and a cover 33 covering the supporting housing 31.

The supporting housing 31 includes a rectangular bottom plate 310, two elongated and parallel first sidewalls 311 extending upwardly from the lateral ends of the bottom plate 310, respectively, and two parallel and elongated second sidewalls 312 extending upwardly from the front and rear ends of the bottom plate 310, respectively. The first sidewalls 311 and the second sidewalls 312 perpendicularly connect to the bottom plate 310. The first sidewalls 311, the second sidewalls 312 and the bottom plate 310 cooperatively define a receiving chamber (not labeled) to receive a plurality of electronic components (not labeled) therein. A top portion of an outer surface of each of the first sidewalls 311 is recessed along a longitudinal direction of the first sidewall 312 to define a V-shaped groove 314 therein. The groove 314 receives a part of the cover 33 therein when the cover 33 is mounted on the supporting housing 31 so as to avoid the cover 33 and the supporting housing 31 interfering with each other. Two tracks 316 extend outwardly from the top ends of the two first sidewalls 311, along opposite horizontal directions, respectively. The track 316 is an L-shaped sheet and is located at a top portion of a corresponding groove 314. Each of the track 316 includes an elongated first stretching portion 3162 extending outwardly from the top end of the first sidewall 311 and a second stretching portion 3163 extending downwardly from an outer edge of the first stretching portion 3162. The first stretching portions 3162 are away from and parallel to each other. A baffle portion 318 extends rearward from a top end of a frontal section of the second sidewalls 312. The baffle portion 313 is an elongated sheet, and is perpendicularly connected to the second sidewall 312.

The cover 33 includes a body 331, two slideways 334, a securing member 335 and two clips 336. The body 331 is a rectangular sheet. The two slideways 334 are formed on the lateral sides of the body 331. Each of the slideway 334 has an L-shaped configuration, and includes a first extending edge 332 extending downwardly from one lateral edge of the body 331 and a second extending edge 333 extending inwardly from a bottom end of the first extending edge 332. The first extending edges 332 face each other and are parallel. The second extending edges 333 are oriented toward each other and are parallel. A width of the first extending edge 332 along a vertical direction is larger than that of the second stretching portion 3163 of the track 316 of the supporting housing 31. Thus, the second stretching portion 3163 is enclosed by the first extending edge 332 and the second extending edge 333 when the cover 33 is mounted on the supporting housing 31. Two blocking portions 337 extend inwardly from a plurality of inner edges of top ends of the two second extending edges 333, respectively. The blocking portion 337 is a rectangular piece to clasp the guideway 40. The securing member 335 extends downwardly from a central portion of a rear end of the body 331. The securing member 335 is a rectangular piece. The clips 336 extend rearward from a front end of the body 331 and are located at the lateral sides of the front end of the body 331, respectively. Each of the clips 336 includes an engaging plate 3361 extending rearward from the front end of the body 331 and two spaced elastic engaging portions 3363 extending downwardly from the engaging plate 3361. Only the rear ends of the elastic engaging portions 3363 are connected to the engaging plate 3361.

Figure 4:
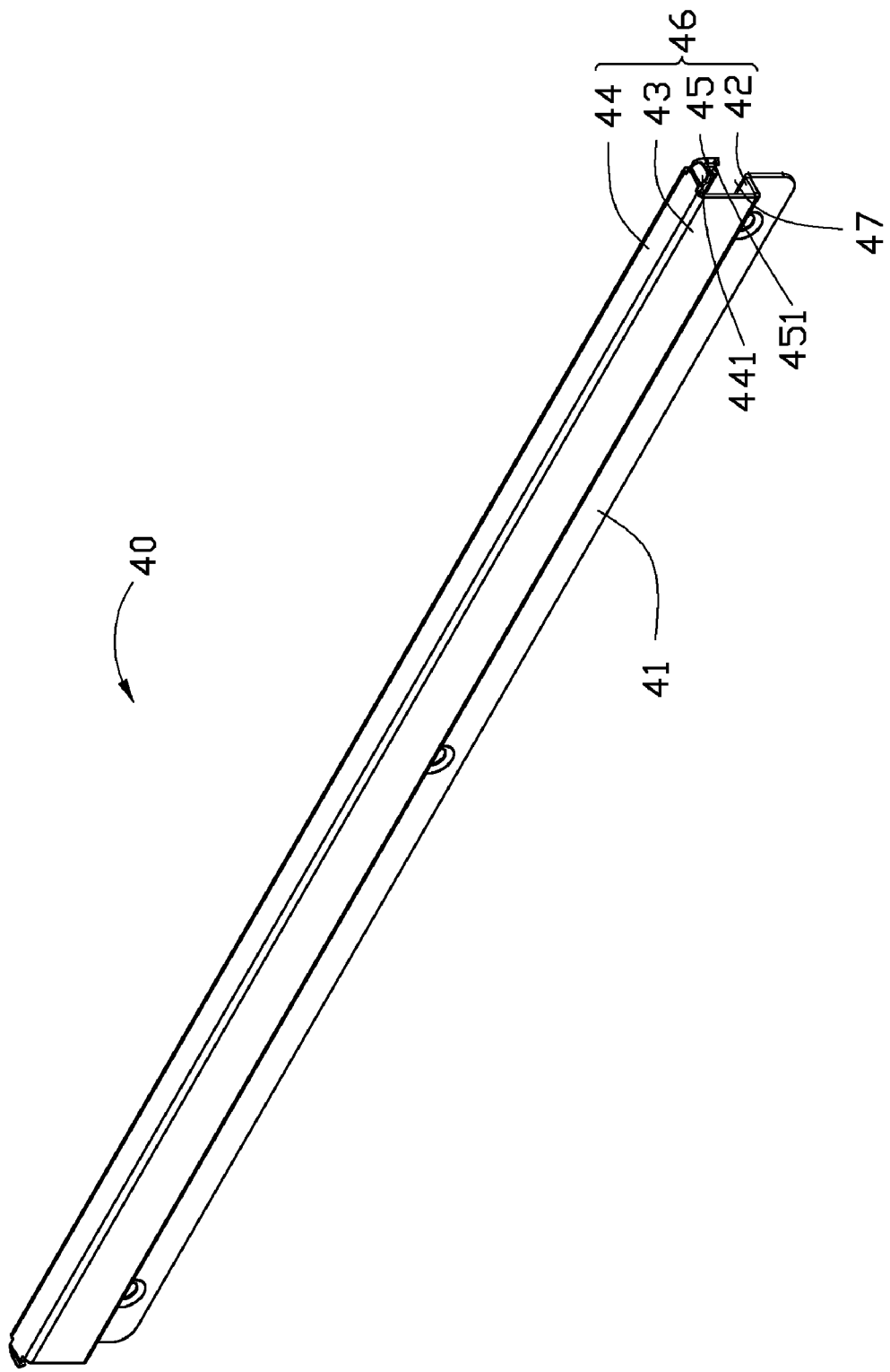
FIG. 4 is an enlarged, isometric view of a guideway of FIG. 1, but shown from a different aspect.
Figure 5:
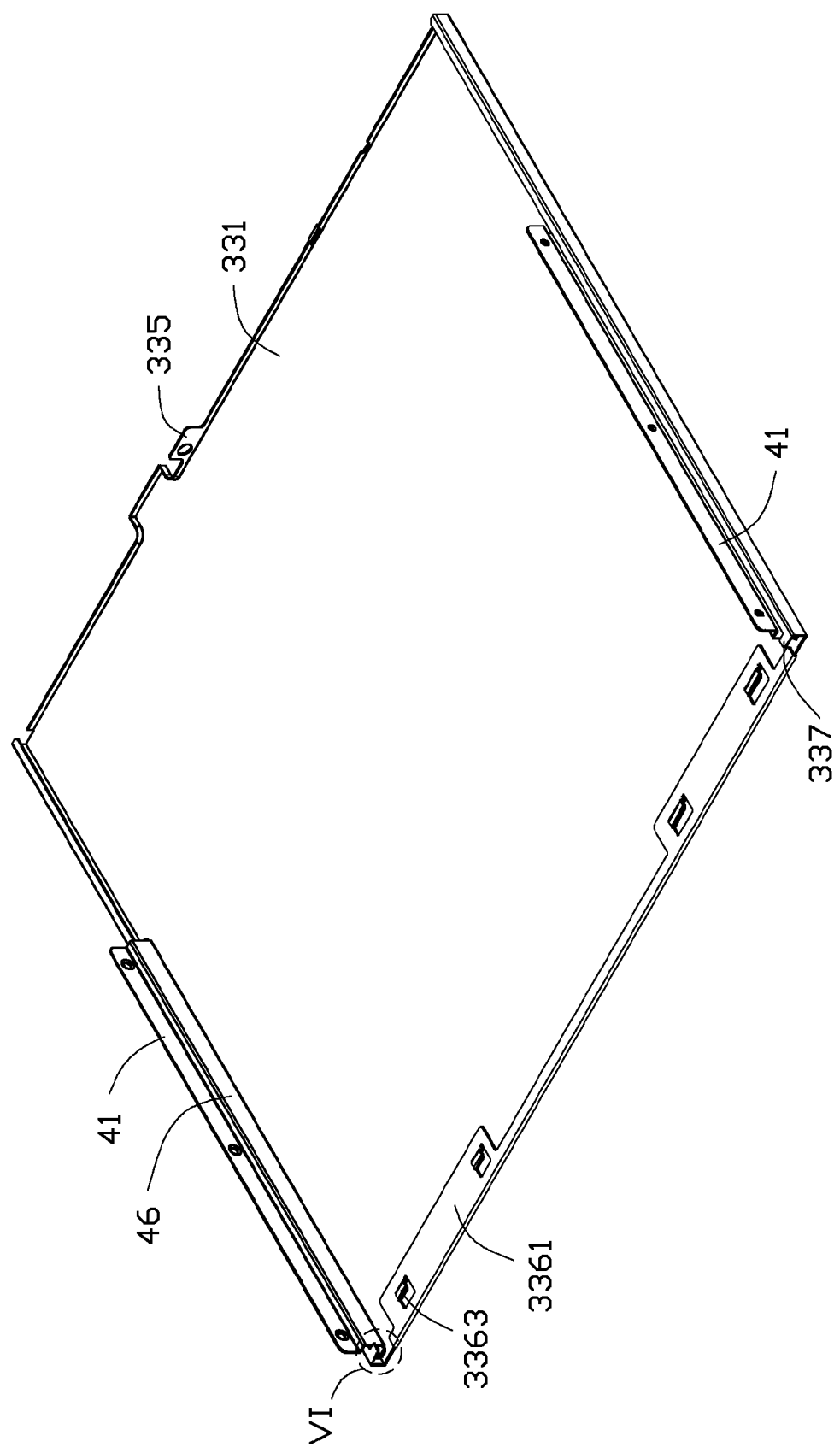
FIG. 5 is an inverted, assembled view of the cover and the guideways of FIG. 2, but is shown from an opposite aspect.
Figure 6:
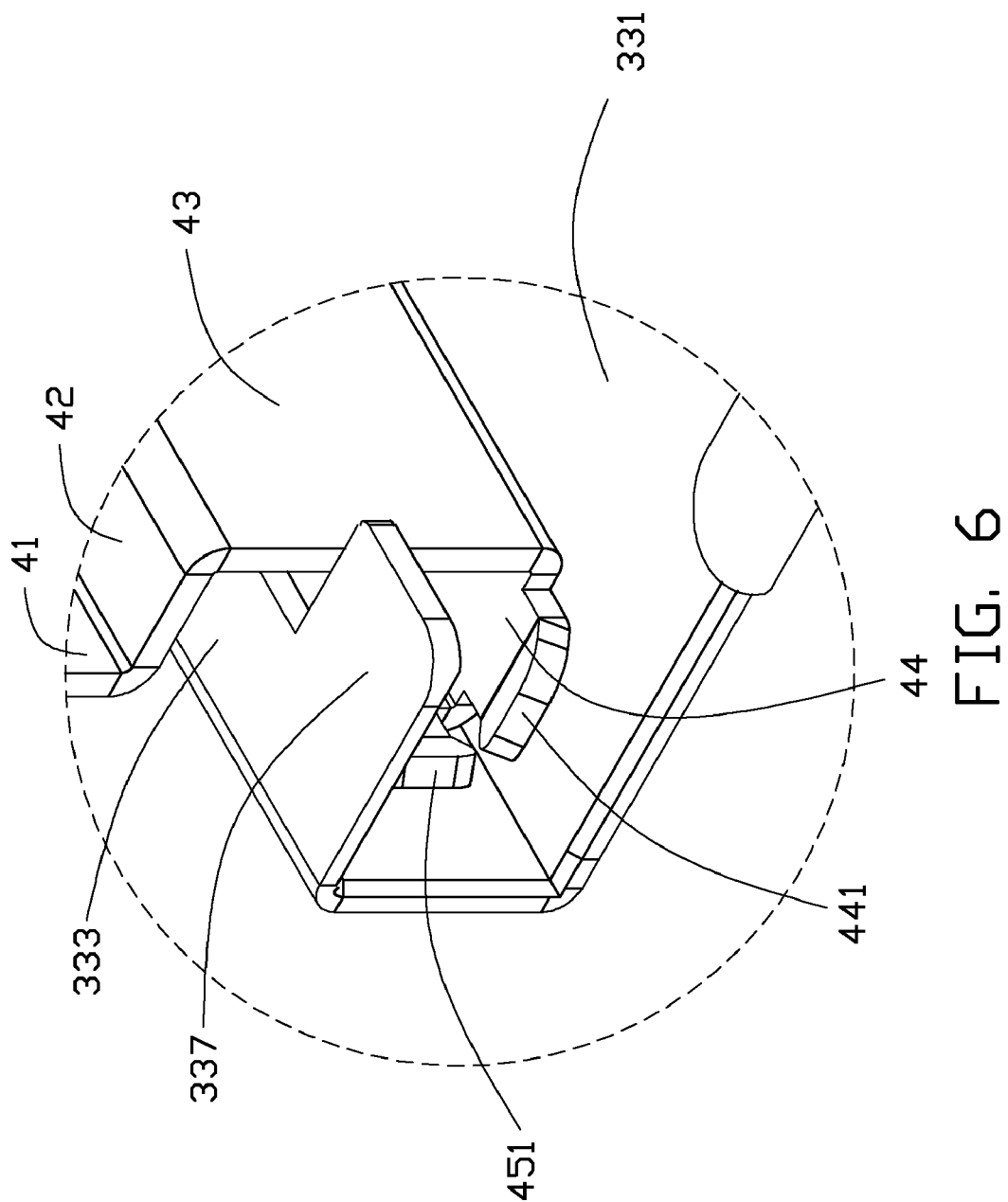
FIG. 6 is an enlarged view of a circular portion VI of FIG. 5.

Referring also to FIG. 4, each of the guideway 40 is a bent sheet, and includes an elongated mounting member 41 and a guiding member 46 connecting a top end of the mounting member 41. The guiding member 46 includes an elongated first spreading portion 42, an elongated first transition portion 43, an elongated second spreading portion 44 and an elongated second transition portion 45. The first spreading portion 42 extends inwardly from a top end of the mounting member 41 and perpendicularly connects the top end of the mounting member 41. The second spreading portion 44 and the first spreading portion 42 are substantially identical. The second spreading portion 44 is located above the first spreading portion 42 and is parallel to the first spreading portion 42. The first transition portion 43 is sandwiched between the first spreading portion 42 and the second spreading portion 44; and the front and rear ends of the first transition portion 43 are perpendicularly connected to the inner ends of the first spreading portion 42 and the second spreading portion 44. The second transition portion 45 is parallel to the first transition portion 43, and extends downwardly from an outer end of the second spreading portion 44.

A width of the second transition portion 45 is smaller than that of the first transition portion 43. A length of the first spreading portion 42 is equal to that of the second spreading portion 44, the first transition portion 43, the second transition portion 45, and to that of the mounting member 41, respectively. Front and rear ends of the first spreading portion 42, and the second spreading portion 44, the first transition portion 43 and the second transition portion 45 define two parallel planes, respectively. The first spreading portion 42, the second spreading portion 44, the first transition portion 43 and the second transition portion 45 cooperatively define a guiding groove 47 to receive the second extending edge 333 of the slideway 334 of the cover 30. Two first guiding plates 441 extend from the front and rear ends of the second spreading portion 44 in a slantwise manner and are oriented toward the first spreading portion 42. In addition, two second guiding plates 451 extend from the front and rear ends of the second transition portion 45 in a slantwise manner, and are oriented toward the first transition portion 43. Each first and second guiding plate 441, 451 is a rectangular plate, and guides the cover 33 when sliding along the guideways 40.

Referring to FIGS. 1-3 again, when the electric assembly is assembled, the two connecting arms 20 are mounted on the opposite lateral sides of the rack 10, and are facing each other. The supporting housing 31 is sandwiched between the two connecting arms 20, and the bottom portions of the first sidewalls 311 are abutted against the connecting arms 20. A plurality of screws (not labeled) extend through the connecting arms 20 and engage with the first sidewalls 311 to secure the supporting housing 31 on the connecting arms 20. Then, the cover 33 is arranged on a rear side of the supporting housing 31, and a front end of the cover 33 is directed towards a rear end of the supporting housing 31. The cover 33 is moved towards the supporting housing 31 by pushing the slideways 334 of the cover 33 to enclose the second stretching portions 3163 of the tracks 316 of the supporting housing 31. The second stretching portions 3163 and the blocking portions 337 are received in the grooves 314 of the supporting housing 31. The slideways 334 slide along the tracks 316 to enable the cover 33 to move towards a front end of the supporting housing 31 until the baffle portion 318 of the supporting housing 31 is clasped or sandwiched by the engaging plates 3361 and the elastic engaging portions 3363 of the clips 336, and the securing member 335 abuts against the second sidewall 312. Then, a screw 50 extends through the securing member 335 and engages with the second sidewall 312 to secure the cover 33 on the supporting housing 31. In this state, the cover 33 covers a top end of the supporting housing 31.

The mounting members 41 are mounted on central portions of the inner surfaces of the connecting arms 20 so as to make the two guiding members 46 orient toward the opposite directions and to aim at the second extending edges 333 of the slideways 334 of the cover 33, respectively. In this state, a gap 60 is defined between the front ends of the guideways 40 and the rear end of the supporting housing 31. A length of the gap 60 along the longitudinal direction of the second extending edge 333 of the slideway 334 is smaller than a length of the slideway 334. Therefore, the cover 33 will engage with the guideways 40 when a part of the cover 33 engages with the supporting housing 31 to avoid the cover 33 from falling off through the gap 60. A length of the blocking portion 337 along the longitudinal direction of the second extending edge 333 is smaller than the length of the gap 60.

Referring to FIGS. 1-2 and 5-6 again, when the electronic components of the supporting housing 31 need to be maintained or replaced, the screw 50 is disassembled from the supporting housing 31. The cover 33 is operated upon to make the clips 336 of the cover 33 disassemble from the baffle portion 318 of the supporting housing 31. The cover 33 moves towards the guideways 40 along the tracks 316 of the supporting housing 31. When a rear portion of the cover 33 spans across the gap 60, the rear ends of the second extending edges 333 contact the first guiding plates 441 and the second guiding plates 451 of the front ends of the second spreading portions 44 and the second transition portions 45. The second extending edges 333 are guided by the first guiding plates 441 and the second guiding plates 451 to slide into the guiding grooves 47 along the bottom ends of the second transition portions 45 until the blocking portions 337 are abutted against the front ends of the first transition portion 43. In this state, the second transition portions 45 are sandwiched between the body 331 and the second extending edges 333. The blocking portions 337 are supported by the lateral ends of the second guiding plates 451. In this state, the front end of the cover 33 is spaced from the rear end of the supporting housing 31 because the length of the blocking portion 337 is smaller than the length of the gap 60.

It is to be understood, however, that even though numerous characteristics and advantages of the disclosure have been set forth in the foregoing description, together with details of the structure and function of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic assembly, comprising:
    a rack;
    two connecting arms, mounted on opposite sides of the rack, and spaced from and facing each other;
    a case comprising a supporting housing and a cover, the supporting housing sandwiched between the connecting arms and secured on the connecting arms, two tracks formed on lateral sides of the supporting housing, the cover forming two slideways which are spaced, the cover covering the supporting housing, and the two slideways enclosing the two tracks and being slidable along the tracks, respectively; and
    two guideways mounted on the connecting arms, respectively;
    wherein, the slideways of the cover slide along the tracks oriented toward the guideways, and engage with the guideways to make the cover slide away from the supporting housing;
    wherein each of the guideways comprises a mounting member mounted on the connecting arm and a guiding member extending from the mounting member, and the slideways are slidable along the guiding members;
    wherein the guiding member comprises a first spreading portion bent inwardly from a top end of the mounting member, a second spreading portion facing and spaced from the first spreading portion, a first transition portion sandwiched between the first and second spreading portions and connecting the inner ends of the first and second spreading portions, and a second transition portion extending downwardly from an outer end of the second spreading portion, and facing and spaced from the first transition portion.

2. The electronic assembly of claim 1, wherein the first spreading portion, the second spreading portion, the first transition portion and the second transition portion cooperatively define a guiding groove therebetween, and a part of the corresponding slideway is received in the guiding groove, and slides along the guiding groove.

3. The electronic assembly of claim 2, wherein the cover comprises a body covering the supporting housing, and the two slideways are formed on opposite lateral sides of the body.

4. The electronic assembly of claim 3, wherein each of the slideways comprises a first extending edge extending downwardly from one of the lateral edges of the body and a second extending edge extending inwardly from a bottom end of the first extending edge, the first extending edges of the slideways face each other, the second extending edges of the slideways are oriented toward each other, each of the tracks is elongated, and the first extending edge and the second extending edge of each slideway encloses a corresponding track therebetween, and the slideway slides along a longitudinal direction of the track.

5. The electronic assembly of claim 4, wherein the second transition portion of each guiding member is sandwiched between the body and the second extending edge of the corresponding slideway, and the second extending edge of the slideway abuts against the second transition portion of the guiding member.

6. The electronic assembly of claim 5, wherein two blocking portions extend inwardly from a plurality of inner edges of the two second extending edges of the slideways to abut against the first transition portions of the guiding members, respectively.

7. The electronic assembly of claim 6, wherein two guiding plates extend slantwise from opposite ends of the second transition portion of each guiding member and are oriented toward the first transition portion of the guiding member, and one guiding plate supports the blocking portion of the corresponding slideway.

8. The electronic assembly of claim 3, wherein a securing member extends downwardly from a rear end of the body to abut against the supporting housing.

9. The electronic assembly of claim 3, wherein a plurality of clips extend rearward from a front end of the body, a baffle portion extends rearward from a top end of the supporting housing, and the clip clasps the baffle portion.

10. The electronic assembly of claim 9, wherein the clip comprises an engaging plate extending rearward from the front end of the body and two spaced elastic engaging portions extending downwardly from the engaging plate, the rear ends of the elastic engaging portions connect to the engaging plate, and the baffle portion is sandwiched between the engaging plate and the elastic engaging portion.

11. The electronic assembly of claim 10, wherein the baffle portion is an elongated plate.

* * * * *